United States Patent
Shimoyama et al.

(10) Patent No.: US 9,472,639 B2
(45) Date of Patent: Oct. 18, 2016

(54) FORMING A LIQUID EJECTION HEAD WITH THROUGH HOLES AND A DEPRESSION

(71) Applicant: CANON KABUSHIKI KAISHA, Tokyo (JP)

(72) Inventors: Hiroyuki Shimoyama, Kawasaki (JP); Taichi Yonemoto, Isehara (JP); Shuji Koyama, Kawasaki (JP); Masaki Ohsumi, Yokosuka (JP); Keiji Matsumoto, Kawasaki (JP); Seiichiro Yaginuma, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/945,617

(22) Filed: Jul. 18, 2013

(65) Prior Publication Data

US 2014/0024148 A1 Jan. 23, 2014

(30) Foreign Application Priority Data

Jul. 20, 2012 (JP) ................................. 2012-161640

(51) Int. Cl.
*H01L 29/66* (2006.01)
*B41J 2/16* (2006.01)

(52) U.S. Cl.
CPC ............ *H01L 29/66007* (2013.01); *B41J 2/16* (2013.01); *B41J 2/1628* (2013.01); *B41J 2/1629* (2013.01); *B41J 2/1632* (2013.01); *B41J 2/1635* (2013.01)

(58) Field of Classification Search
CPC ............ H01L 29/66007; B41J 2/1631; B41J 2/1626; B41J 2/1628; B41J 2/1629; B41J 2/1632; B41J 2/1635; B41J 2/164; B41J 2/1634; B41J 2/1621
USPC ........................................................ 438/21
See application file for complete search history.

(56) References Cited

U.S. PATENT DOCUMENTS

| | | | |
|---|---|---|---|
| 2004/0246292 A1* | 12/2004 | Hashimoto | B41J 2/14314 347/20 |
| 2006/0028508 A1* | 2/2006 | Chen et al. | 347/47 |
| 2007/0017895 A1* | 1/2007 | Yotsuya | G03F 1/14 216/41 |
| 2008/0277806 A1* | 11/2008 | Chen et al. | 257/797 |
| 2010/0078407 A1* | 4/2010 | Lebens et al. | 216/27 |
| 2010/0253743 A1* | 10/2010 | Takeuchi | B41J 2/162 347/47 |
| 2010/0323526 A1* | 12/2010 | Kishimoto et al. | 438/753 |
| 2013/0109113 A1* | 5/2013 | Baldi et al. | 438/21 |

FOREIGN PATENT DOCUMENTS

| | | | |
|---|---|---|---|
| JP | 2011-083787 A | | 4/2011 |
| WO | WO 2011/154394 | * | 12/2011 |

* cited by examiner

*Primary Examiner* — Peter Bradford
(74) *Attorney, Agent, or Firm* — Canon U.S.A. Inc., IP Division

(57) ABSTRACT

A method of manufacturing a substrate of a liquid ejection head including: forming a plurality of recesses in a silicon wafer; etching the silicon wafer with etchant to form a depression and a plurality of through holes formed from the plurality of the recesses in the depression; and manufacturing a plurality of substrates of the liquid ejection head from the silicon wafer by dividing the silicon wafer on the basis of through holes.

8 Claims, 4 Drawing Sheets

FORMING A LIQUID EJECTION HEAD WITH THROUGH HOLES AND A DEPRESSION

BACKGROUND OF THE INVENTION

1. Field of the Invention

The present disclosure relates to a method of manufacturing a substrate of a liquid ejection head.

2. Description of the Related Art

As a method of locally reducing a thickness of a silicon wafer which forms a substrate of a liquid ejection head, Japanese Patent Laid-Open No. 2011-83787 discloses a method of using a transformed portion obtained by irradiating a silicon wafer with a laser beam to transform the material. In this method, the silicon wafer is locally reduced in thickness by removing the transformed portion formed in the silicon wafer with etchant, and forming a depression on the silicon wafer.

SUMMARY OF THE INVENTION

The invention provides a method of manufacturing a substrate of a liquid ejection head including:
forming a plurality of recesses in a silicon wafer; etching the silicon wafer with etchant to form a depression and a plurality of through holes formed from the plurality of the recesses in the depression; and manufacturing a plurality of the substrates of the liquid ejection head from the silicon wafer by dividing the silicon wafer on the basis of through holes.

Further features of the present invention will become apparent from the following description of exemplary embodiments with reference to the attached drawings.

DESCRIPTION OF THE EMBODIMENTS

In a method disclosed in Japanese Patent Laid-Open No. 2011-83787, control of irradiation of a laser beam is difficult, and the depth of irradiation of the laser beam varies, so that the thickness of a depression to be formed in a silicon wafer may become irregular throughout the depression. In addition, when a supply port is formed by forming a through hole in the depression, there is a problem that an additional step for forming the through hole is needed.

Accordingly, the present invention provides a method of manufacturing a substrate of a liquid ejection head which is capable of making the thickness of the depression formed in the silicon wafer uniform, equalizing the shapes of the substrates of the liquid ejection head to be manufactured, and forming the through hole easily in the depression.

Modes for implementing the present invention will be described in detail.

Figure 1A:
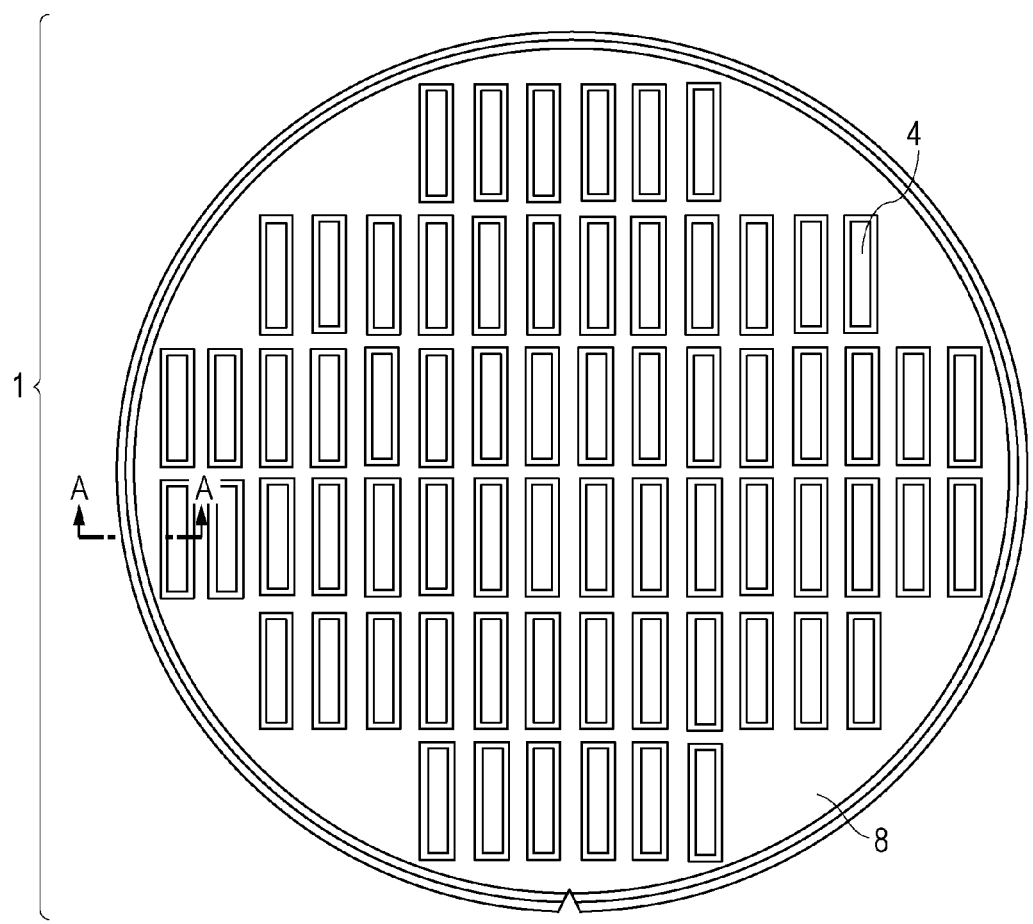
FIGS. 1A and 1B are drawings illustrating a silicon wafer.

A substrate of a liquid ejection head of the invention is obtained by dividing a silicon wafer 1 illustrated in FIG. 1A. In other words, a plurality of the substrates of the liquid ejection head are obtained from the silicon wafer 1. The silicon wafer 1 is formed with a plurality of through holes 4 and each of the plurality of through holes is formed in a corresponding one of the substrates of the liquid ejection head. The through hole 4 may be used as a supply port formed on the substrate of the liquid ejection head, for example.

The silicon wafer 1 includes a depression 8. The depression 8 is formed over an entire surface of the silicon wafer 1 except for an end of the silicon wafer 1. In FIG. 1A, one depression is formed on one silicon wafer. By the provision of the depression 8, the silicon wafer may be locally reduced in thickness.

Figure 1B:
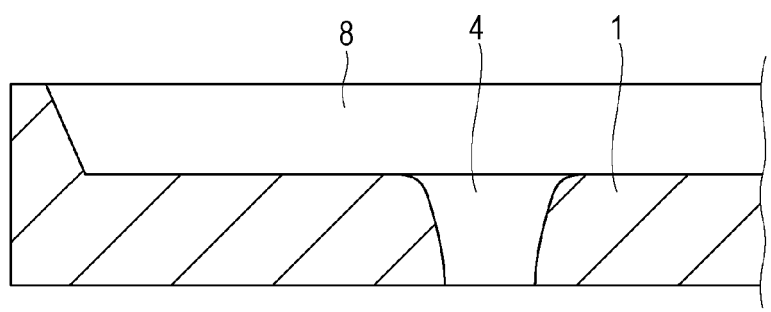

The plurality of the through holes 4 are formed in the depression. FIG. 1B illustrates a cross-sectional view taken along a line A-A in FIG. 1A. As illustrated in FIG. 1B, the through holes 4 are formed at positions one step lower than the depression 8.

First Embodiment

Referring now to FIGS. 2A to 2F, an embodiment of a method of manufacturing the substrates of the liquid ejection head will be described. FIGS. 2A to 2F illustrate a cross section taken along the line A-A in FIG. 1A.

Figure 2A:
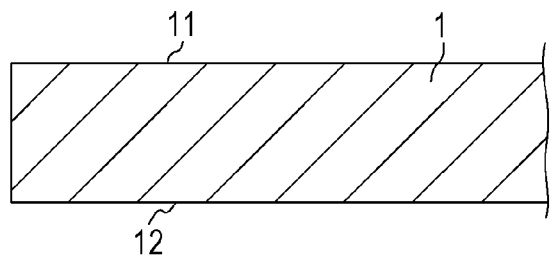
FIGS. 2A to 2F are drawings illustrating an embodiment of a method of manufacturing a liquid ejection head of the invention.

First of all, as illustrated in FIG. 2A, a silicon wafer 1 is prepared. The silicon wafer includes a first surface 11 and a second surface 12. On the second surface 12 side, an energy generating element configured to generate energy for ejecting liquid and a member for forming an insulating film, flow channels, and ejection ports are formed as needed. When the liquid is ink, the liquid ejection head is referred to as an ink jet recording head.

On the first surface 11 side, a silicon oxide film may be formed. In such a case, the silicon oxide film is removed by etching using, for example, a buffered hydrofluoric acid or the like. The crystal orientation of the silicon wafer, more specifically, the crystal orientations of the first surface 11 and the second surface 12 are preferably (100). As long as the silicon wafer has such a crystal orientation, a depression may be preferably formed.

Figure 2B:
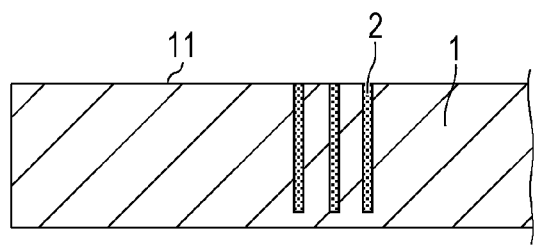

Subsequently, as illustrated in FIG. 2B, a plurality of recesses 2 are formed in the silicon wafer 1. The recesses do not pass through the silicon wafer. The recesses 2 are preferably formed by performing laser irradiation or dry etching from the first surface 11 side of the silicon wafer 1. Processing conditions when forming the recesses 2 by using a laser are, for example, a wavelength of 355 nm, a frequency of 100 kHz, an output of 10 W, a laser focus of 0 (substrate surface), and a target depth of 644 μm.

Figure 2C:
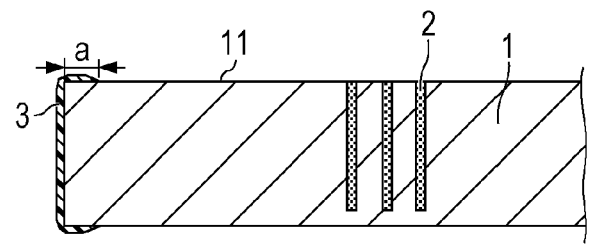

Subsequently, as illustrated in FIG. 2C, an outer periphery of the silicon wafer 1 is covered with a protective film 3. Accordingly, when etching the silicon wafer with etchant in subsequent steps, the outer periphery of the silicon wafer 1 may be protected from the etchant.

The protective film 3 may be of any type as long as it is resistant to the etchant. For example, cyclized rubber-based resins or waxes are exemplified. More specifically, for example ProTEK (name of product manufactured by BREWER SCIENCE) may be used. Not only the outer periphery of the silicon wafer 1, but also part of the first surface 11 side is preferably covered with the protective film 3. In FIG. 2C, the first surface 11 of the silicon wafer 1 is covered with the protective film 3 only over a width indicated by "a". The width "a" determines a width "A" in FIG. 2F. In other words, the width "a" determines the outer peripheral shape of the silicon wafer 1. More specifically, the expression width "A"=width "a" (um)–etching time (min)× 1.04 (um/min) is established. The width "a" may be determined on the basis of conditions when the protective film 3 is formed. For example, when the protective film 3 is formed with a rotating apparatus, the width "a" may be adjusted by changing the rotating speed of the silicon wafer 1.

Figure 2D:
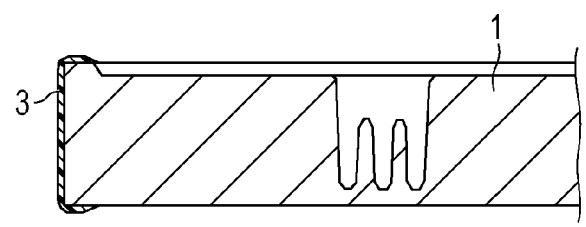

Subsequently, as illustrated in FIG. 2D, the silicon wafer 1 is etched with etchant. The etchant may be of any type as long as it is a liquid capable of etching the silicon wafer, and preferably a liquid capable of etching anisotropically. More specifically, a strongly basic solution is exemplified, and Tetramethylammonium Hydroxide (TMAH), potassium hydroxide, sodium hydroxide, cesium hydroxide, lithium hydroxide, or the like may be used. Among others, a TMAH solution is preferably used. The TMAH from 5% by mass to 25% by mass inclusive is preferably included in the TMAH solution. The temperature of the etchant is preferably set to a range from 70° C. to 85° C. inclusive. A surfactant may be added to the etchant.

Figure 2E:
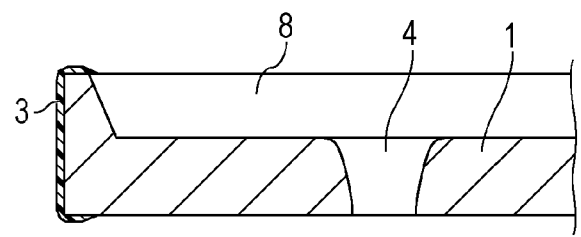

When the etching with the etchant is continued, the silicon wafer 1 is formed with the depression 8 and the through hole 4 as illustrated in FIG. 2E. The depression 8 is formed from the first surface 11 side of the silicon wafer 1. When the crystal orientation of the first surface 11 is (100), if anisotropic etching is continued, a surface having a crystal orientation of (111) appears on a side surface of the depression 8. The surface (111) is preferable because it is highly resistant to the liquid. The through hole 4 is formed with progression of etching from the non-penetrate hole 2. When the plurality of recesses 2 are formed close to each other, these recesses 2 are joined into one through hole 4. The plurality of the through holes 4 are formed in the depression of the silicon wafer 1.

The etchant is preferably kept away from contact with the second surface 12 side of the silicon wafer 1. When the etchant comes into contact with the second surface 12 due to the specifications of an apparatus used for the etching, the second surface is preferably protected with a protective film. The protective film may be of any type as long as it is resistant to the etchant, and the same film as the protective film 3 may be used.

In this manner, in the invention, the depression 8 and the through holes 4 may be formed at once in the silicon wafer 1 by the etchant coming into contact with the first surface 11 and the recesses 2 of the silicon wafer 1 at once. The through holes 4 may be each used as a supply port formed on the substrate of the liquid ejection head.

Figure 2F:
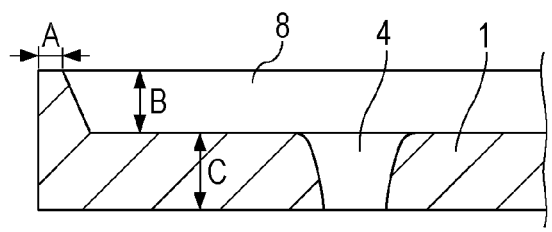

Subsequently, as illustrated in FIG. 2F, the protective film 3 covering the outer periphery is removed by xylene or the like. The depth of the depression 8 formed on the silicon wafer 1 (indicated by a width B) and the depth of each of the through holes 4 (indicated by a width C) may be determined in accordance with the thickness of the silicon wafer and the etching time.

Subsequently, the silicon wafer 1 is divided on the basis of through holes 4 formed therein. The division of the silicon wafer is performed by cutting the silicon wafer by using a dicing blade, for example. The division on the basis of through holes refers to a division in which one divided piece includes one through hole. Alternatively, one divided piece may include two through holes, for example. One divided piece constitutes one substrate of the liquid ejection head. In other words, by dividing the silicon wafer on the basis of through holes, a plurality of substrates of the liquid ejection head may be manufactured from one silicon wafer.

Second Embodiment

Referring now to FIGS. 3A to 3F, an embodiment of the method of manufacturing the substrates of the liquid ejection head will be described. FIGS. 3A to 3F illustrate a cross section taken along the line A-A in FIG. 1A.

Figure 3A:
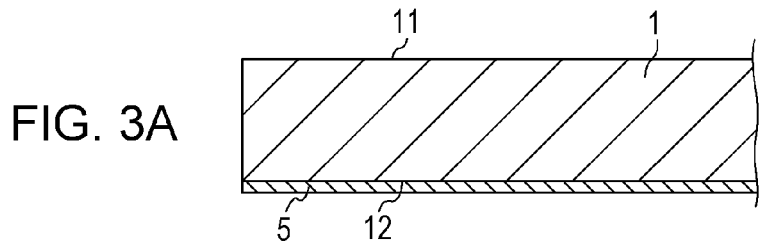
FIGS. 3A to 3F are drawings illustrating an embodiment of a method of manufacturing a liquid ejection head of the invention.

First of all, as illustrated in FIG. 3A, a silicon wafer 1 is prepared. The silicon wafer includes a first surface 11 and a second surface 12. In the second embodiment, a protective film 5 is formed on the second surface 12 side. Examples of the protective film 5 include a silicon oxide ($SiO_2$) film and a silicon nitride (SiN) film. For example, when a silicon oxide film is formed as the protective film 5, the silicon wafer 1 may be oxidized by heat.

Figure 3B:
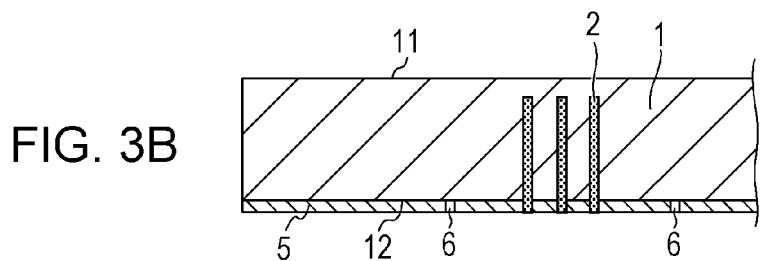

Subsequently, as illustrated in FIG. 3B, a plurality of recesses 2 are formed in the silicon wafer 1. The recesses 2 are preferably formed by performing laser irradiation or dry etching on the second surface 12 side of the silicon wafer 1. The second surface 12 side is formed with the protective film 5, and the recesses 2 are formed so as to penetrate through the protective film 5. Laser processing conditions may be the same as those in the first embodiment. Additional holes 6 different from the recesses 2 may be formed after the formation of the recesses 2 or at the same time as the formation of the recesses 2. The holes 6 are shallower (shorter) than the non-penetrated holes 2, penetrate through the protective film 5 on the second surface 12 side, and expose the silicon wafer 1. Alternatively, the holes 6 may be formed so as to engrave the silicon wafer 1 in addition to exposing the silicon wafer 1. The holes 6 are formed by laser irradiation or dry etching. By forming the holes 6, division is facilitated when dividing the silicon wafer 1 on the basis of through holes 4 in the subsequent step. Specifically, when the division is performed by using a dicing blade, formation of the holes 6 significantly enhances machinability. The holes 6 may be formed not only by engraving the silicon wafer 1, but also by puncturing the same so as to penetrate through the silicon wafer 1. Penetration of the holes 6 through the silicon wafer 1 may be achieved by forming the holes 6 deeply, for example, or by etching from the first surface 11 side. When the holes 6 penetrate through the silicon wafer 1, the silicon wafer 1 may be divided even without using the dicing blade or the like. Since the holes 6 correspond to points along which the silicon wafer 1 is divided, the holes 6 are formed by the substrate of the liquid ejection head. The holes 6 are preferably formed so as to surround each of the recesses 2.

Figure 3C:
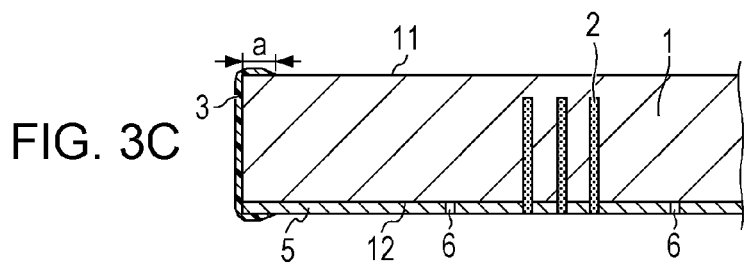
Figure 3D:
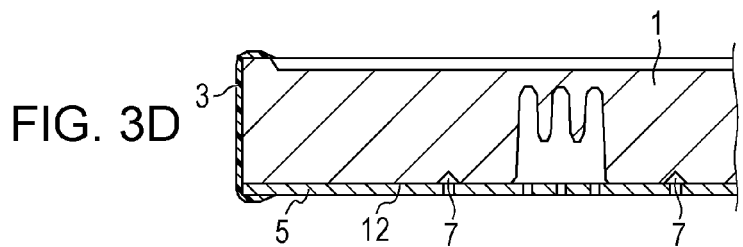
Figure 3E:
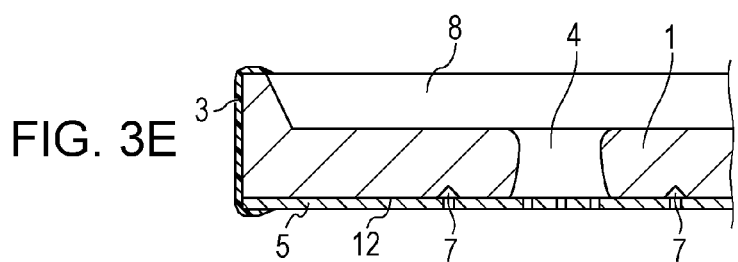

Subsequently, in the same manner as the first embodiment, an outer periphery of the silicon wafer 1 is covered with a protective film 3 (FIG. 3C). Subsequently, in the same manner as the first embodiment, the silicon wafer 1 is etched with the etchant (FIG. 3D). When the etching with the etchant is continued, the silicon wafer 1 is formed with a depression 8 and the through holes 4 as illustrated in FIG. 3E. The protective film 5 on the second surface 12 side remains on the second surface. The etching progresses from the holes 6, and dicing lines 7 are formed.

Figure 3F:
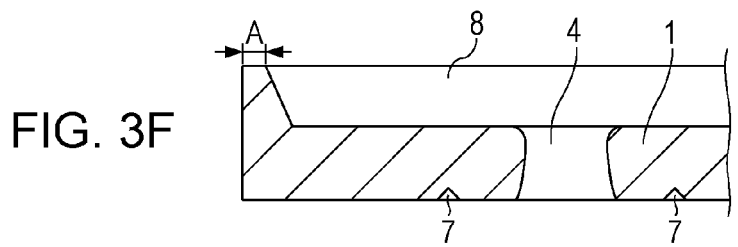

Subsequently, as illustrated in FIG. 3F, the protective film 3 covering the outer periphery is removed by using xylene or the like. Subsequently, the protective film 5 on the second surface 12 side is removed. When the protective film 5 is formed of $SiO_2$, the protective film 5 is removed by using hydrogen fluoride or the like. When the protective film 5 is formed of SiN, the protective film 5 is removed by dry etching or the like.

Subsequently, the silicon wafer 1 is divided on the basis of through holes 4 formed therein. The division of the silicon wafer is performed by cutting the silicon wafer by using a dicing blade, for example. In this case, cutting is performed along the dicing lines 7 by using a dicing blade. In contrast, when the holes 6 formed by dry etching or the like penetrate through the silicon wafer, an operation of cutting the silicon wafer with a dicing blade is not necessary. This is because the holes 6 penetrate through the silicon wafer and hence the division has already been completed. In this manner, the holes 6 and the dicing lines 7 are preferably formed so as to surround each of the through holes 4 because the holes 6 and the dicing lines 7 correspond to portions along which the substrates of the liquid ejection head are divided.

In this procedure, a plurality of the substrates of the liquid ejection head may be manufactured from one silicon wafer.

Third Embodiment

Referring now to FIGS. 4A to 4G, an embodiment of a method of manufacturing the substrates of the liquid ejection head will be described. FIGS. 4A to 4G illustrate a cross section taken along the line A-A in FIG. 1A.

Figure 4A:
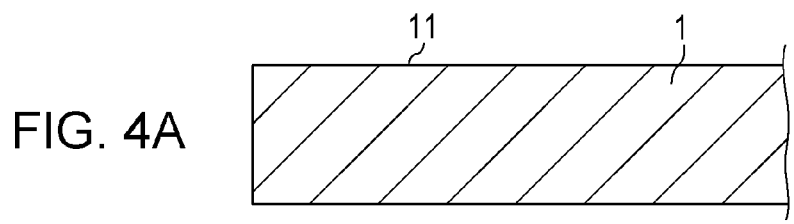
FIGS. 4A to 4G are drawings illustrating an embodiment of a method of manufacturing a liquid ejection head of the invention.

First of all, in the same manner as the first embodiment, as illustrated in FIG. 4A, a silicon wafer 1 is prepared.

Figure 4B:
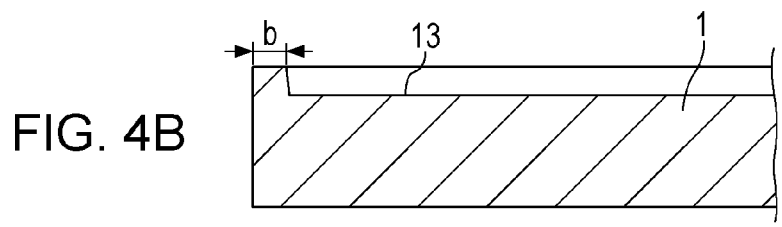

Subsequently, as illustrated in FIG. 4B, a surface of the silicon wafer 1 to be subjected to etching, that is, a first surface 11 is ground. Grinding is performed for example by a mechanical grinding process. At this time, an area near an outer periphery of the silicon wafer 1 remains. The area near the outer periphery corresponds to a portion denoted by a width "b" in FIG. 4B. The mechanical grinding process is performed by using a back grind apparatus or the like. When the mechanical grinding process is performed, a crystal strained layer is generated on a ground surface 13.

Figure 4C:
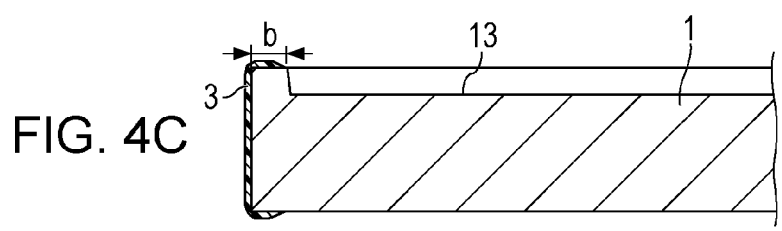

Subsequently, in the same manner as the first embodiment, the outer periphery of the silicon wafer 1 is covered with a protective film 3 as illustrated in FIG. 4C. In this case, the area in the vicinity of the outer periphery is covered with the protective film 3.

Figure 4D:
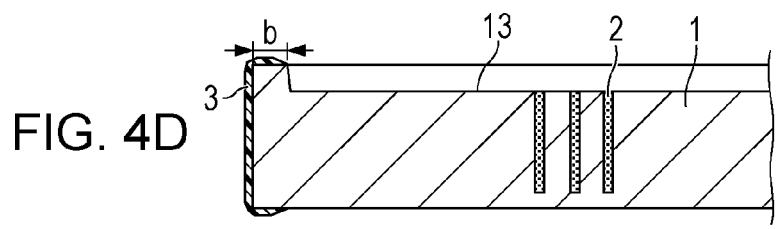

Subsequently, in the same manner as the first embodiment, the plurality of recesses 2 are formed on the silicon wafer 1 as illustrated in FIG. 4D. The recesses 2 are preferably formed by performing laser irradiation or dry etching from the first surface 11 side of the silicon wafer 1.

Figure 4E:
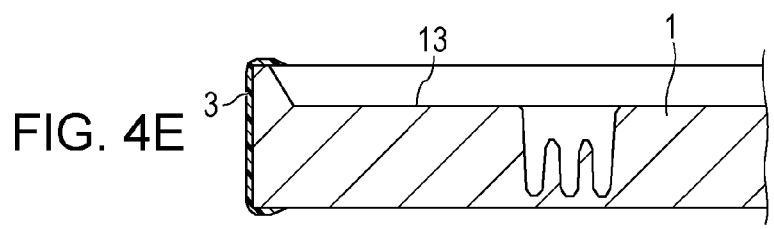
Figure 4F:
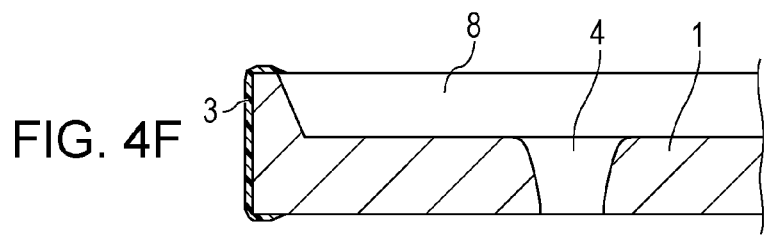

Subsequently, in the same manner as the first embodiment, the silicon wafer 1 is etched with etchant as illustrated in FIG. 4E. In this embodiment, the crystal strained layer generated on the ground surface 13 may be removed by the etching. The etchant may be the same liquid as that used in the first embodiment. When the etching with the etchant is continued, the silicon wafer 1 is formed with a depression 8 and a through hole 4 as illustrated in FIG. 4F. Only the end of the depression remains in an amount corresponding to the area in the vicinity of the outer periphery (the portion indicated by a width "D").

Figure 4G:
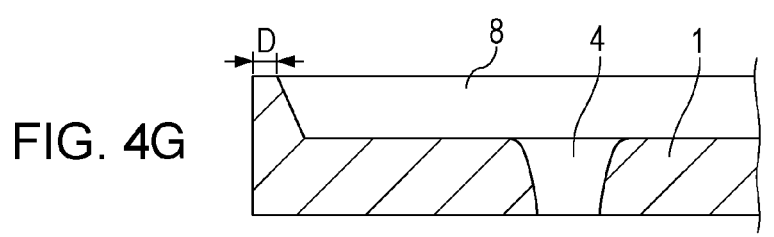

Subsequently, as illustrated in FIG. 4G, the protective film 3 covering the outer periphery is removed by xylene or the like. Subsequently, the silicon wafer 1 is divided on the basis of through holes 4 formed therein. Division may be performed in the same manner as the first embodiment.

In this procedure, a plurality of substrates of the liquid ejection head may be manufactured from one silicon wafer. In this embodiment, in order to locally reduce the thickness of the substrate of the liquid ejection head, the first surface 11 side of the silicon wafer 1 is mechanically ground by a mechanical grinding process. Accordingly, although a crystal strained layer is generated, the crystal strained layer may be removed by etching, whereby the change of the shape of the depression due to the crystal strained layer may be suppressed.

According to the invention, the thickness of the depression formed in a silicon wafer may be made uniform, the shapes of the substrates of the liquid ejection head to be manufactured may further be equalized, and a through hole may be formed easily in the depression.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-161640, filed Jul. 20, 2012, which is hereby incorporated by reference herein in its entirety.

What is claimed is:

1. A method of manufacturing a substrate of a liquid ejection head comprising:
    forming a plurality of recesses in a first surface of a silicon wafer, the first surface being opposite to a second surface where the second surface aids in ejecting liquid;
    covering an outer periphery of the silicon wafer with a protective film, and etching the silicon wafer with etchant to form a depression formed on the first surface of the silicon wafer;
    forming a plurality of through holes formed from the plurality of recesses in the depression; and
    manufacturing a plurality of substrates of the liquid ejection head from the silicon wafer by dividing the silicon wafer on the basis of the through holes formed from the plurality of recesses.

2. The method of manufacturing a substrate of a liquid ejection head according to claim 1, wherein part of the first surface side of the silicon wafer is covered with the protective film when etching the silicon wafer with the etchant.

3. The method of manufacturing a substrate of a liquid ejection head according to claim 1, further comprising grinding the surface of the silicon wafer to be subjected to the etching with the etchant before forming the plurality of recesses in the silicon wafer.

4. The method of manufacturing a substrate of a liquid ejection head according to claim 1, wherein the recesses are formed by laser irradiation or dry etching.

5. The method of manufacturing a substrate of a liquid ejection head according to claim 1, wherein the through holes are supply ports of the liquid ejection head.

6. The method of manufacturing a substrate of a liquid ejection head according to claim 1, further comprising forming holes different from the plurality of through holes formed from the plurality of recesses in the silicon wafer.

7. The method of manufacturing a substrate of a liquid ejection head according to claim 6, wherein the different holes are used as a dicing line used when the silicon wafer is divided on the basis of the through holes formed from the plurality of recesses.

8. The method of manufacturing a substrate of a liquid ejection head according to claim 6, wherein formation of the different holes is performed by dry etching.

* * * * *